United States Patent
Peixoto et al.

(10) Patent No.: US 11,709,201 B2
(45) Date of Patent: Jul. 25, 2023

(54) INSTRUMENT NOISE CORRECTION FOR JITTER MEASUREMENTS

(71) Applicant: Skyworks Solutions, Inc., Irvine, CA (US)

(72) Inventors: Daniel De Godoy Peixoto, Austin, TX (US); Gregory J. Richmond, Cupertino, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 39 days.

(21) Appl. No.: 17/009,480

(22) Filed: Sep. 1, 2020

(65) Prior Publication Data

US 2022/0065927 A1 Mar. 3, 2022

(51) Int. Cl.
*G01R 31/317* (2006.01)
*G01R 29/26* (2006.01)

(52) U.S. Cl.
CPC ....... *G01R 31/31709* (2013.01); *G01R 29/26* (2013.01); *G01R 31/31725* (2013.01)

(58) Field of Classification Search
CPC ............................................. G01R 31/31709
USPC ....................................................... 375/226
See application file for complete search history.

(56) References Cited

U.S. PATENT DOCUMENTS

| | | | |
|---|---|---|---|
| 6,311,313 B1 * | 10/2001 | Camporese | G06F 1/10 716/113 |
| 8,891,602 B1 | 11/2014 | Giust | |
| 11,018,681 B1 * | 5/2021 | Hamilton | H03M 1/0836 |
| 2006/0064258 A1 * | 3/2006 | Mochizuki | G01R 29/26 702/69 |
| 2013/0221231 A1 * | 8/2013 | Kono | G01T 3/00 250/391 |
| 2014/0253358 A1 * | 9/2014 | Lorenz | H03M 1/56 341/155 |

OTHER PUBLICATIONS

PCI Express "PCI Express® Base Specification," Revision 5.0, Version 1.0, May 22, 2019, 1299 pages.
Silicon Labs, "AN946: PCI-Express 4.0 Jitter Requirements," Rev. 0.2, downloaded from Silabs.com, Aug. 27, 2020, 38 pages.

(Continued)

*Primary Examiner* — Lihong Yu
(74) *Attorney, Agent, or Firm* — Knobbe, Martens, Olson & Bear, LLP

(57) ABSTRACT

A time error vector is determined using pairs of two closest points of input-referred noise data that straddle respective crossing times indicating when a clock signal representation crosses a threshold value, a slew rate of the clock signal representation, and the crossing times. A system filter is applied to the time error vector in the frequency domain. A first RMS value is determined indicating a jitter value present in the filtered time error vector. A raw clock signal time error vector of the clock signal under test is generated, the system filter is applied to the raw clock signal time error vector in the frequency domain, and a second RMS value indicating a jitter content of the filtered raw clock signal time error vector is determined. The second RMS value is corrected using the first RMS value to thereby generate a jitter measurement compensated for input-referred noise.

20 Claims, 10 Drawing Sheets

(56) References Cited

OTHER PUBLICATIONS

Silicon Labs, "AN1104: Making Accurate PCIe Gen 4.0 Clock Jitter Measurements," Rev. 0.1, downloaded from Silabs.com, Aug. 26, 2020, 11 pages.
Silicon Labs, "Welcome Internet Infrastructure and Industrial Automation Tech Talks," downloaded from https://vww.silabs.com/products/development tools/software/clock, Aug. 26, 2020, 21 pages.
Texas Instruments, "Noise-2, TIPL 1312, TI Precision Labs—Op Amps," downloaded from training.ti.com, Aug. 23, 2020, 17 pages.

* cited by examiner

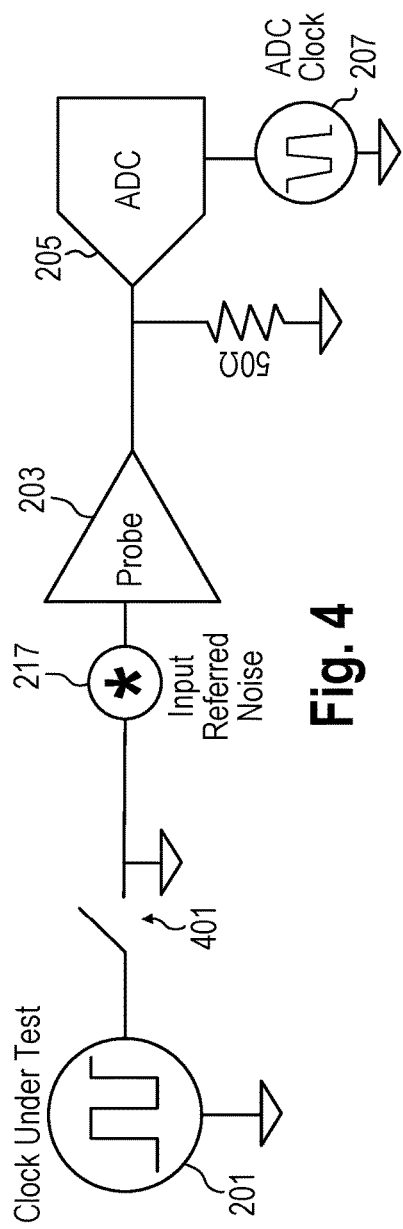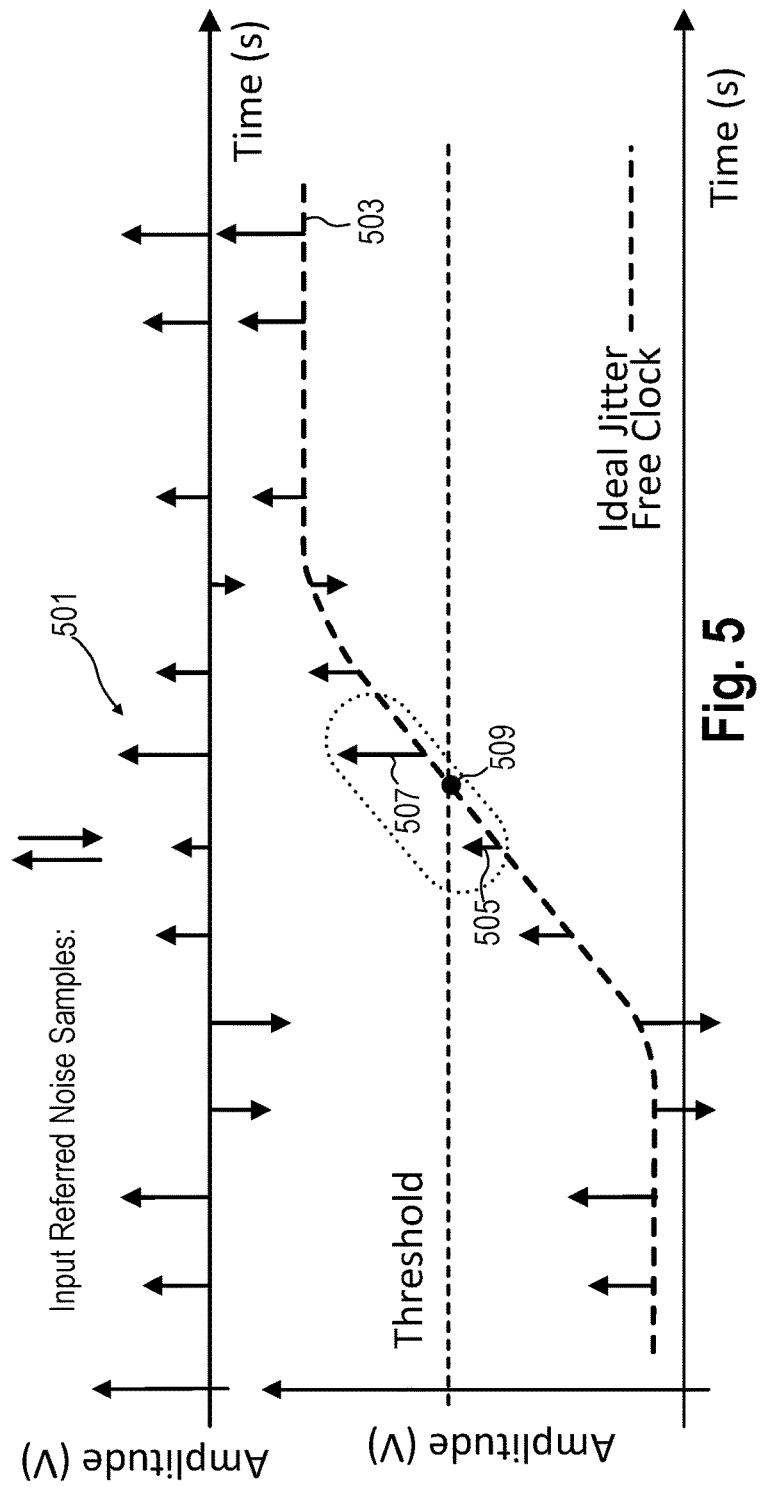

INSTRUMENT NOISE CORRECTION FOR JITTER MEASUREMENTS

BACKGROUND

Field of the Invention

This application relates to jitter measurements and more particularly to correcting for noise from a source other than the clock signal under test.

Description of the Related Art

Jitter measurements determine whether a clock signal under test complies with desired jitter performance. The desired jitter performance may be based on requirements associated with a specific high-speed interconnect standard for connecting high-speed components such as PCI Express®, also referred to as PCIe® where PCI® stands for (Peripheral Component Interconnect). The measured jitter determines how closely the clock signal under test matches an ideal clock signal.

Using current techniques a user testing a clock signal can use an expensive phase noise analyzer, e.g., E5052B SSA Signal Source Analyzer from Keysight Technologies, which only measures phase noise, or use a relatively inexpensive mixed signal oscilloscope, which also measures signal integrity, and decide between using a 50 ohm SMA (subminiature version A) termination to get a clean jitter measurement and distort the clock signal under test, which ruins the signal integrity measurement or use an active probe that maintains signal integrity, but gives excessively high jitter values. Improvements in post processing jitter compensation would allow for use of less costly equipment with performance close to more expensive solutions.

SUMMARY OF EMBODIMENTS OF THE INVENTION

In one embodiment a non-volatile computer readable medium stores instructions to determine jitter in a clock signal under test that, and when the instructions are executed by a processor, the instructions cause the processor to determine two points of input-referred noise data around a crossing time. A first point of the two points is prior to the crossing time and a second point of the two points is after the crossing time. The crossing time is a time that a clock signal representation crosses a threshold value, the clock signal representation corresponding to the clock signal under test. The software determines a first time error associated with the crossing time using the two points of the input-referred noise data, a clock slew rate of the clock signal representation, and the crossing time.

In another embodiment a method of determining jitter in a clock signal under test includes determining two points in input-referred noise data for each of a plurality of crossing times. A first of the two points is prior to each of the crossing times of the plurality of the crossing times and a second point of the two points is after each of the crossing times, the crossing times indicating when a clock signal representation corresponding to the clock signal under test crosses a threshold voltage value. The method further includes determining respective time errors associated with the crossing times using the two points of the input-referred noise data for each of the plurality of crossing times, a slew rate of the clock signal representation, and the crossing times and determining a time error vector based on the respective time errors.

In another embodiment a method of correcting for jitter in a clock signal under test includes receiving input-referred noise data and determining for respective crossing times, pairs of two closest points of the input-referred noise data that straddle each of the respective crossing times, the crossing times indicative of respective times a clock signal representation crosses a threshold value. The method further includes determining a time error vector associated with the crossing times using the pairs of two closest points, a slew rate of the clock signal representation, and the crossing times. A transform is performed on the time error vector to generate a frequency domain time error vector. A system filter is applied to the frequency domain time error vector to generate a filtered time error vector. A first root mean square (RMS) value is determined indicating a jitter value present in the filtered time error vector. A raw clock signal time error vector of the clock signal under test is generated and the raw clock signal time error vector is converted to a frequency domain raw clock signal time error vector. The same system filter is applied to the frequency domain raw clock signal time error vector to generate a filtered raw clock signal time error vector and a second RMS value indicating a jitter content of the filtered raw clock signal time error vector is determined. The second RMS value is corrected using the first RMS value to thereby generate a compensated jitter measurement that is compensated for input-referred noise.

BRIEF DESCRIPTION OF THE DRAWINGS

The present invention may be better understood, and its numerous objects, features, and advantages made apparent to those skilled in the art by referencing the accompanying drawings.

FIG. 4 illustrates a test setup to measure the input-referred noise.

FIG. 5 shows the input-referred noise samples superimposed on the ideal jitter free clock signal.

The use of the same reference symbols in different drawings indicates similar or identical items.

DETAILED DESCRIPTION

Figure 1:
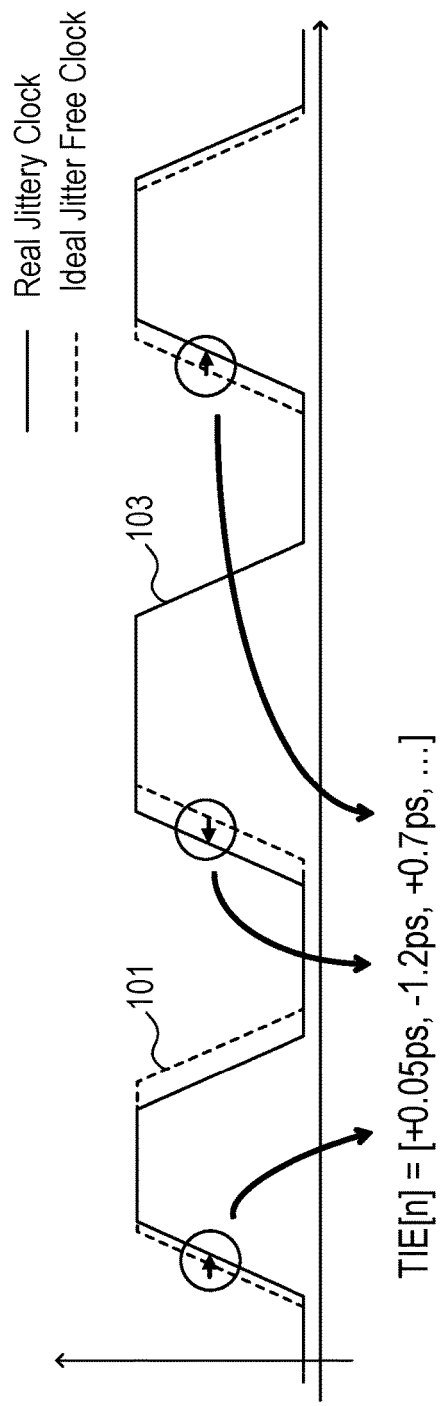
FIG. 1 illustrates an ideal jitter free clock signal superimposed on a jittery clock signal.

FIG. 1 illustrates an ideal jitter free clock signal 101 and a real clock signal 103 that contains jitter. In the illustrated embodiment each jittery rising edge differs from the ideal rising edge contributing to a time interval error (TIE). Jitter can come from multiple sources. For example, jitter can be caused by various noise sources in the clock generation circuit, such as thermal noise associated with resistors or flicker noise associated with transistors. Additionally, the system measuring jitter can also add jitter.

Figure 2:
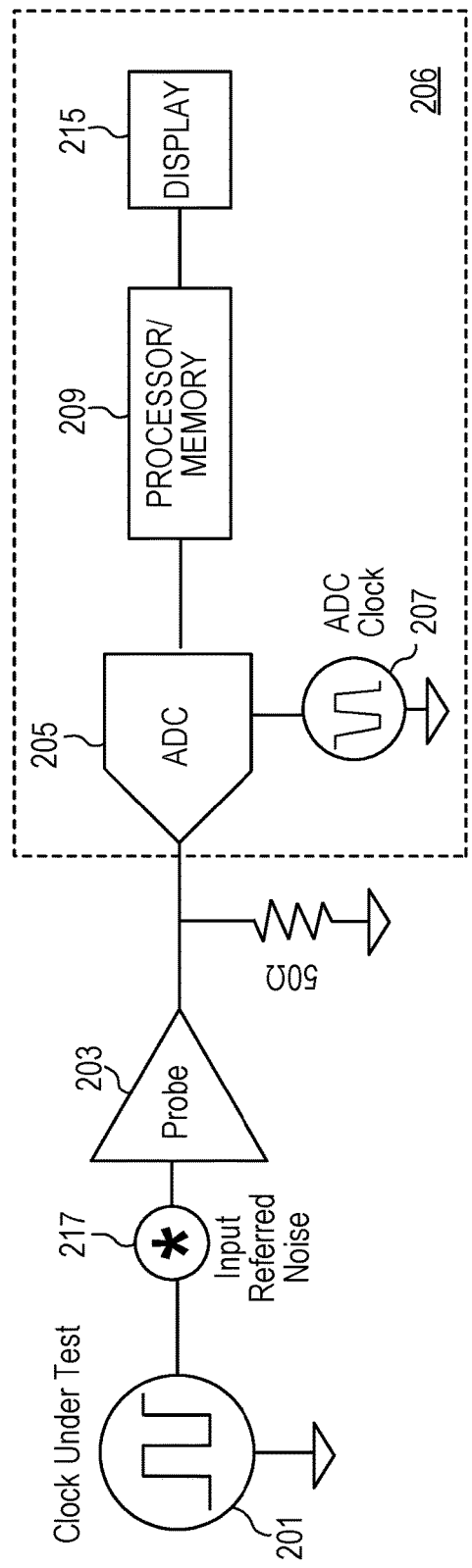
FIG. 2 illustrates a block diagram of a test set up to test a clock signal under test.

FIG. 2 illustrates a block diagram of a test set up to test a clock signal under test 201. The illustrated embodiment uses a probe 203, which is coupled to an analog to digital converter (ADC) 205 of an oscilloscope 206. The ADC 205 samples the clock signal under test using the ADC clock 207. The digital samples are supplied to a processor/memory 209 and the digital samples are displayed on a display 215 as a clock waveform. While the sampled values will include the jitter present in the clock signal under test, the sampled values also include jitter from other sources. One source is input-referred noise 217. Input-referred voltage noise is the equivalent noise voltage present at the input to the probe 203 resulting from noise at the probe 203 input, noise internal to the probe 203, noise at the input to the ADC 205 and noise internal to the ADC 205 with the clock signal under test disconnected and the probe coupled to a DC voltage such as ground. Another jitter source is jitter associated with the ADC clock signal 207. The object of embodiments described herein is to compensate for the input-referred noise that is present in the sampled values of the clock signal under test.

Figure 3:
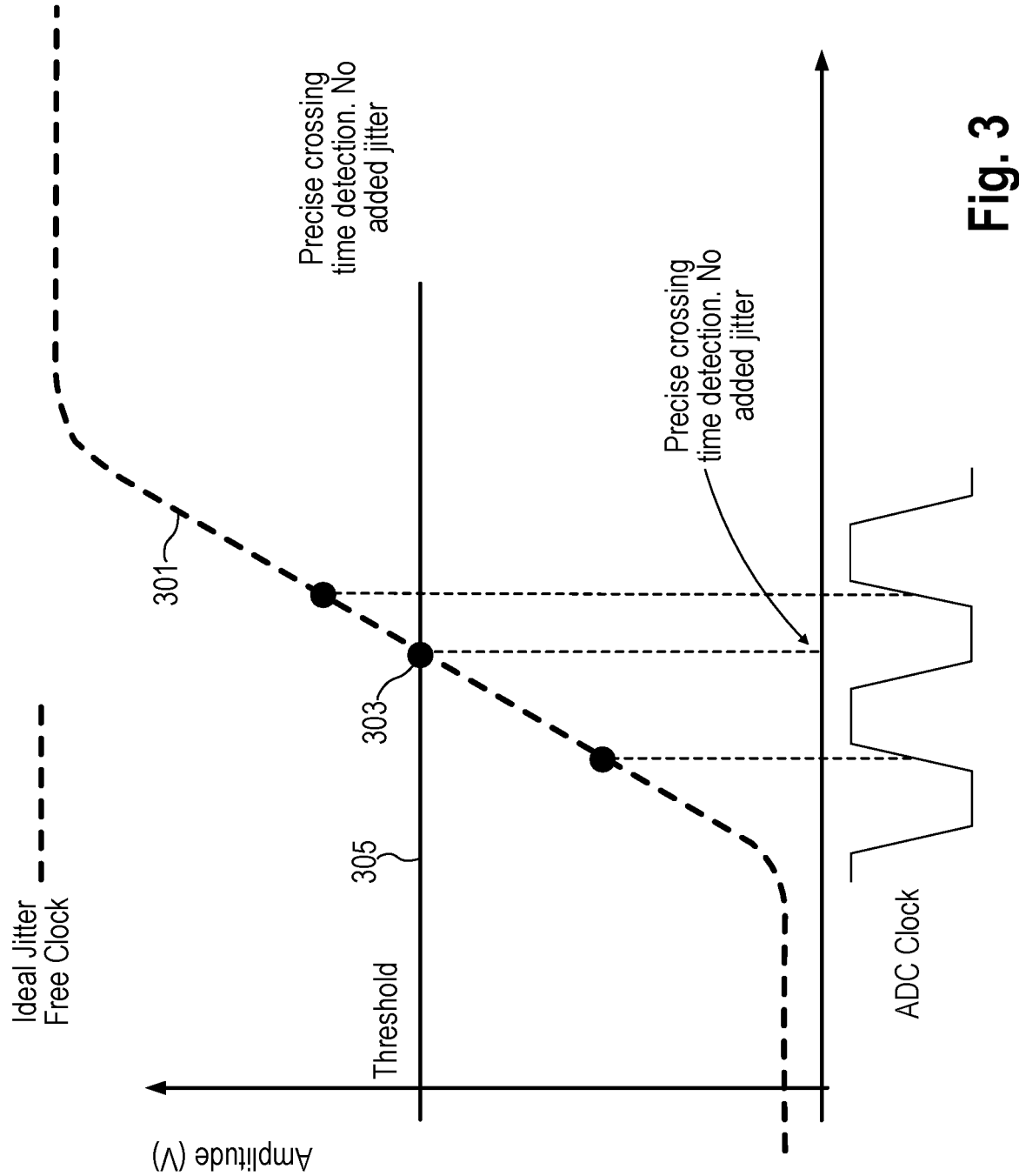
FIG. 3 illustrates the threshold crossing time of an ideal clock signal.

FIG. 3 illustrates the threshold crossing time of an ideal clock signal 301. The threshold crossing time 303 is the time at which the amplitude of the clock signal crosses the threshold 305 causing the logical value of the clock signal to transition from one digital value to a second digital value. In the embodiment illustrated in FIG. 3 the ideal jitter free clock transitions from a "0" to a "1". The ADC clock signal is asynchronous to the clock signal being measured and thus captures values on either side of the crossing time. The crossing time 303 can be determined based on the slew rate of the ideal clock signal. The slew rate is the slope of the ideal clock signal between the sampled measurements. The ideal clock slew rate can be measured or estimated. In an embodiment the slew rate is the average slew rate of the clock signal under test. The slew rate can also be calculated as the (maximum measured slew rate+the minimum measured slew rate)/2.

FIG. 4 illustrates a test setup to measure the input-referred noise 217. In the test setup, the switch 401 is opened, disconnecting the probe 203 from the clock signal under test 201 and the input to the probe is grounded. ADC 205 samples the input-referred noise and stores the samples for later use. FIG. 5 illustrates how the input-referred noise samples 501 relate to the ideal jitter free clock 503. Two of the input-referred noise samples 505 and 507 are of particular interest. Those noise samples are located on either side of the threshold crossing point 509 of the ideal jitter free clock period. In an embodiment, the ideal jitter free clock signal is a clock signal representation with a nominal frequency $f_{nom}$ with a period $T_{nom}$ equal to $1/f_{nom}$. In other embodiments, the ideal jitter free clock signal is based on an average period of the clock signal under test. The next rising edge crossing time will be one clock period $T_{nom}$ after the rising edge crossing time at 509. As explained further herein, a TIE vector is determined using the rising edge crossing times of the ideal jitter free clock signal and the two closest samples on either side of the rising edge crossing times. That TIE vector will be used to determine the jitter contribution from the input-referred noise and is used to correct the jitter measurements of the clock signal under test as described further herein. Note that other jitter sources, e.g., the jitter associated with the ADC sampling clock are not addressed using the input-referred noise compensation techniques described herein.

Figure 6:
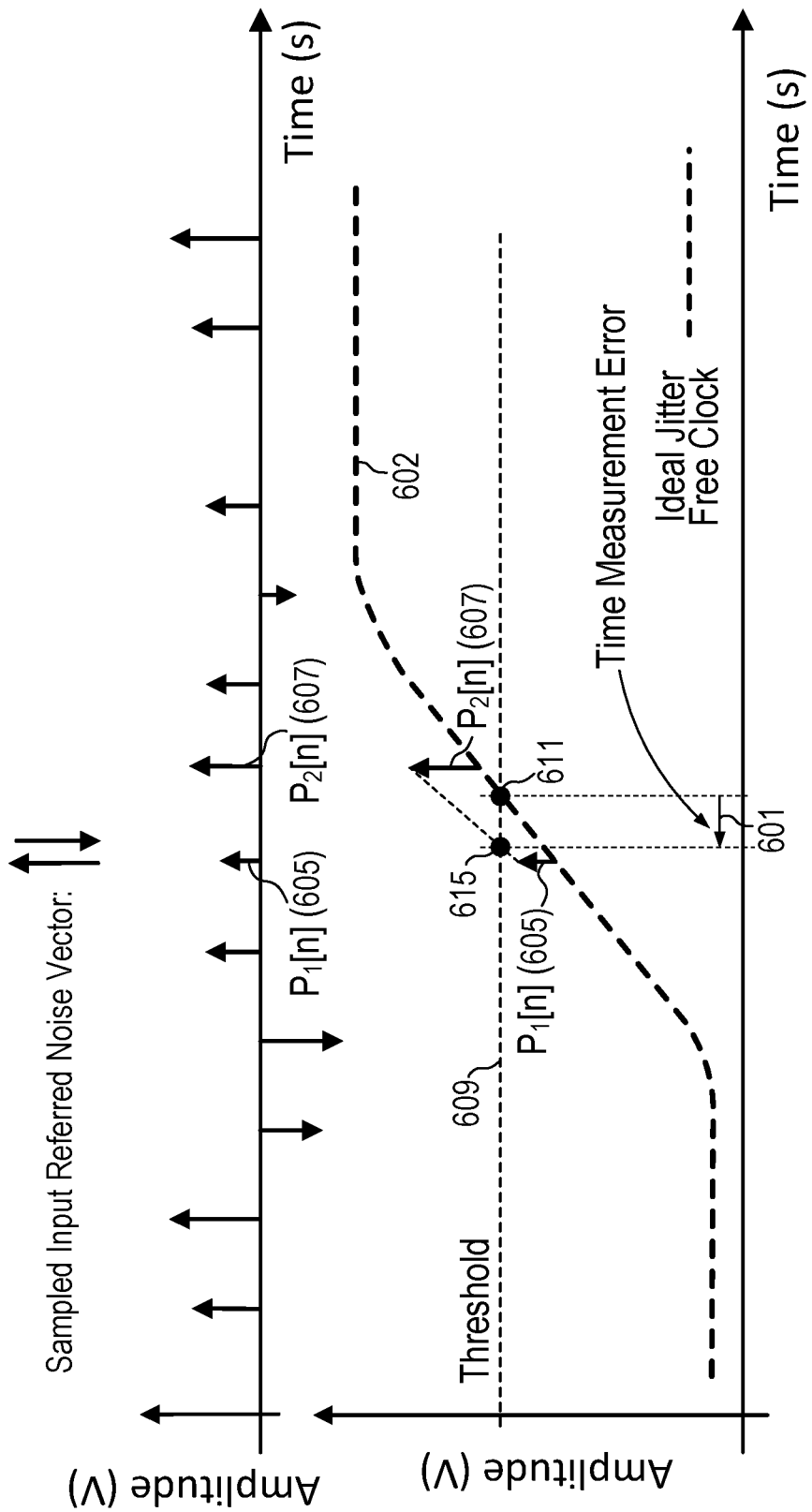
FIG. 6 illustrates graphically how the time measurement error is determined using two input-referred noise samples on either side and closest to the rising edge crossing time.

FIG. 6 illustrates graphically how the time measurement error 601 is determined for each rising edge "n" of the ideal clock signal 602 using the input-referred noise samples $P_1[n]$ 605 and $P_2[n]$ 607, where "n" is the index corresponding to the nth rising edge of the clock signal. The ideal jitter free clock signal 602 crosses the threshold voltage 609 at 611 indicating when the clock signal transitions from a "0" to a "1". The input-referred noise sampled as $P_1[n]$ and $P_2[n]$ causes the rising edge crossing time to change. In the example of FIG. 6, the rising edge crossing time changes from 611 to 615 resulting in the time measurement error 601. The new crossing time is determined by extrapolating the slew rate from the displacement of the ideal clock signal caused by $P_1[n]$ to the displacement caused by $P_2[n]$. Note that the number of sampled points of the input-referred noise is significantly reduced to only two points straddling each rising edge crossing time. Thus, rather than requiring all the noise samples, only subsamples are needed to make the jitter correction. The time interval error (TIE) can be calculated as follows:

$$TIE_{noise}[n] = \frac{\left(P_1[n] + (P_2[n] - P_1[n]) \times \frac{SR \times T_{crossing}[n] - P_1[n]}{SR \times T_{period} + P_2[n] - P_1[n]}\right)}{SR} \quad (1)$$

where $P_1[n]$ is the first point before the rising edge crossing, $P_2[n]$ is the first point after the rising edge crossing, $T_{period}$ is a period of the ADC sampling clock used to sample the input-referred noise, SR is the slew rate of the ideal clock signal, $T_{crossing}[n]$ is the crossing time value, and n is the index of the crossing time and the index of crossing time error being determined. A time interval error is determined for each rising edge crossing point. Note that while a rising edge crossing time is utilized in embodiments described herein, other embodiments, can utilize a falling edge crossing time. If the exact $T_{crossing}[n]$ isn't available, a conservative approximation is to assume $T_{crossing}[n]=T_{period}/2$. Such an approximation will result in the lowest possible transfer function bandwidth for the conversion of the input-referred noise to TIE.

Figure 7:
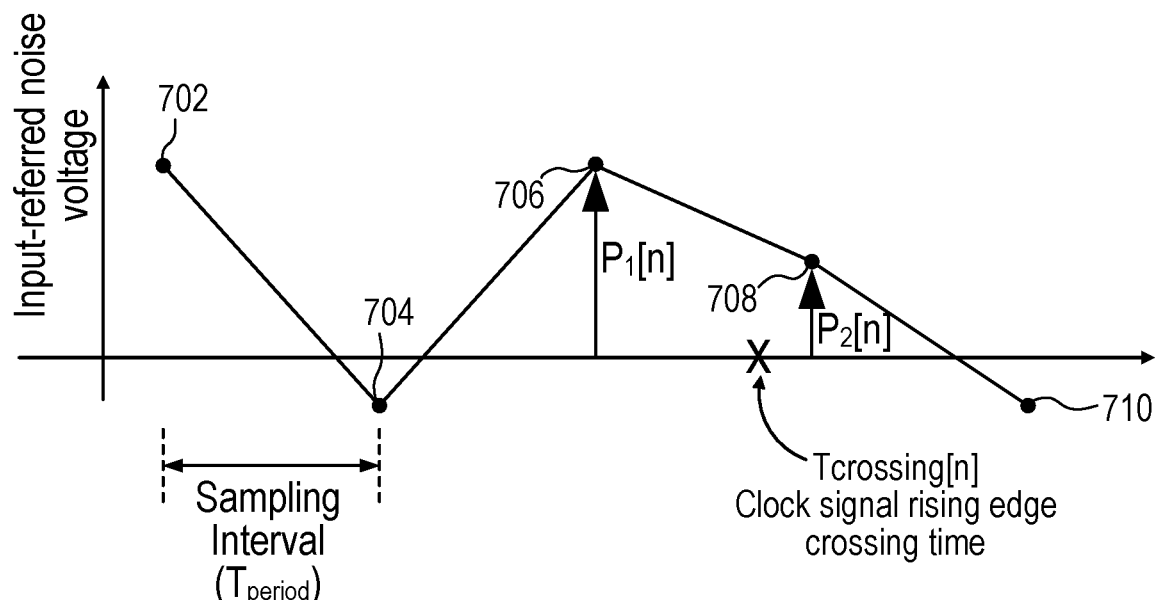
FIG. 7 illustrates another view of the sampled input-referred noise voltage.

FIG. 7 illustrates another view of the sampled input-referred noise voltage at sample points 702, 704, 706, 708, and 710. $P_1[n]$ and $P_2[n]$ represent the magnitude and sign of those samples 706 and 708 that are closest to the ideal crossing time 701 that would occur absent the input-referred noise. FIG. 7 also shows the sampling interval ($T_{period}$) of the ADC clock. Notice that, even for equal values of $P_1[n]$ and $P_2[n]$, the time error is still dependent on clock signal rising edge crossing time described in equation 1. Clock signals where Tnom is not an integer multiple of the sampling interval might systematically steer the rising edge crossing time closer to $P_1[n]$ or $P_2$ The approach described herein allows for the estimation of the maximum and minimum time error independent of the clock signal rising edge crossing time. The following equation defines $TIE_{noise,MAX}[n]$ as equal to the largest absolute value between $$\frac{P_1[n]}{SR} \text{ and } \frac{P_2[n]}{SR}.$$

$$TIE_{noise,MAX}[n] = \left\{ x \in \left[\frac{P_1[n]}{SR}, \frac{P_2[n]}{SR}\right] : |x| \geq |a| \forall a \in \left[\frac{P_1[n]}{SR}, \frac{P_2[n]}{SR}\right] \right\}.$$

Thus, $TIE_{noise,MAX}[n]$ is a value x, belonging to the interval $$\left[\frac{P_1[n]}{SR}, \frac{P_2[n]}{SR}\right]$$

such that $|x| \geq |a|$ for every a belonging to the interval $$\left[\frac{P_1[n]}{SR}, \frac{P_2[n]}{SR}\right].$$

The following equation defines $TIE_{noise,MIN}[n]$ as the smallest absolute value between $$\frac{P_1[n]}{SR} \text{ and } \frac{P_2[n]}{SR}.$$

$$TIE_{noise,MIN}[n] = \left\{ x \in \left[\frac{P_1[n]}{SR}, \frac{P_2[n]}{SR}\right] : |x| \leq |a| \forall a \in \left[\frac{P_1[n]}{SR}, \frac{P_2[n]}{SR}\right] \right\}.$$

Thus, $TIE_{noise,MIN}[n]$ is a value x, belonging to the interval $$\left[\frac{P_1[n]}{SR}, \frac{P_2[n]}{SR}\right]$$

such that $|x| \leq |a|$ for every a belonging to the interval $$\left[\frac{P_1[n]}{SR}, \frac{P_2[n]}{SR}\right].$$

As shown later herein, the maximum value over corrects for the time error caused by input-referred voltage noise while the minimum error under corrects for the time error caused by the input-referred voltage noise. Assuming the threshold falls within the $[P_1[n], SR \times T_{period} + P_2[n]]$ region, using the maximum and minimum limit values $$SR \times T_{crossing}[n] \in [P_1[n], SR \times T_{period} + P_2[n]],$$

the TIE value from equation (1) will be bounded by $$\left[\frac{P_1[n]}{SR}, \frac{P_2[n]}{SR}\right].$$

Figure 8:
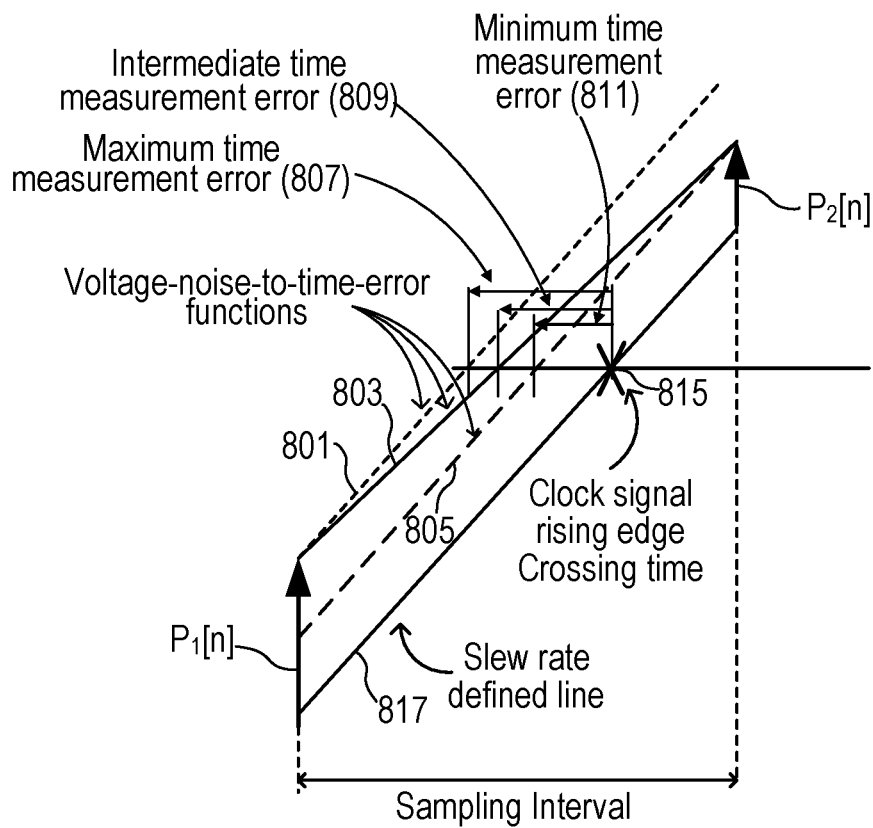
FIG. 8 illustrates the maximum, minimum, and intermediate crossing time voltage noise to crossing time error functions.

FIG. 8 illustrates the maximum, minimum, and intermediate crossing time voltage noise to crossing time error functions. The error can be a maximum time measurement error, a minimum time measurement, or an intermediate time error measurement. FIG. 8 shows voltage-noise-to-time-error functions 801, 803, and 805. Those three functions result in a maximum timer error measurement 807, an intermediate time error measurement 809, and a minimum time error measurement 811. The time error measurements are due to the shift in the threshold crossing time from 815 to the new crossing time based on the voltage-noise-to-time-error functions. FIG. 8 also illustrates the slew rate 817 of the ideal clock signal. The maximum voltage-noise-to-time-error function 801 can be seen graphically to be the largest error voltage of the sample points $P_1[n]$ and $P_2[n]$, here $P_1[n]$, and extending from the top of $P_1[n]$ (displacement to the ideal clock caused by $P_1[n]$) using the slew rate shown at 817. The minimum voltage-noise-to-time-error function 805 can be seen graphically to be the smallest error voltage of the points $P_1[n]$ and $P_2[n]$, here $P_2[n]$, extending from the top of P2[n] (displacement to the ideal clock caused by $P_2[n]$) using the slew rate shown at 817.

Figure 9A:
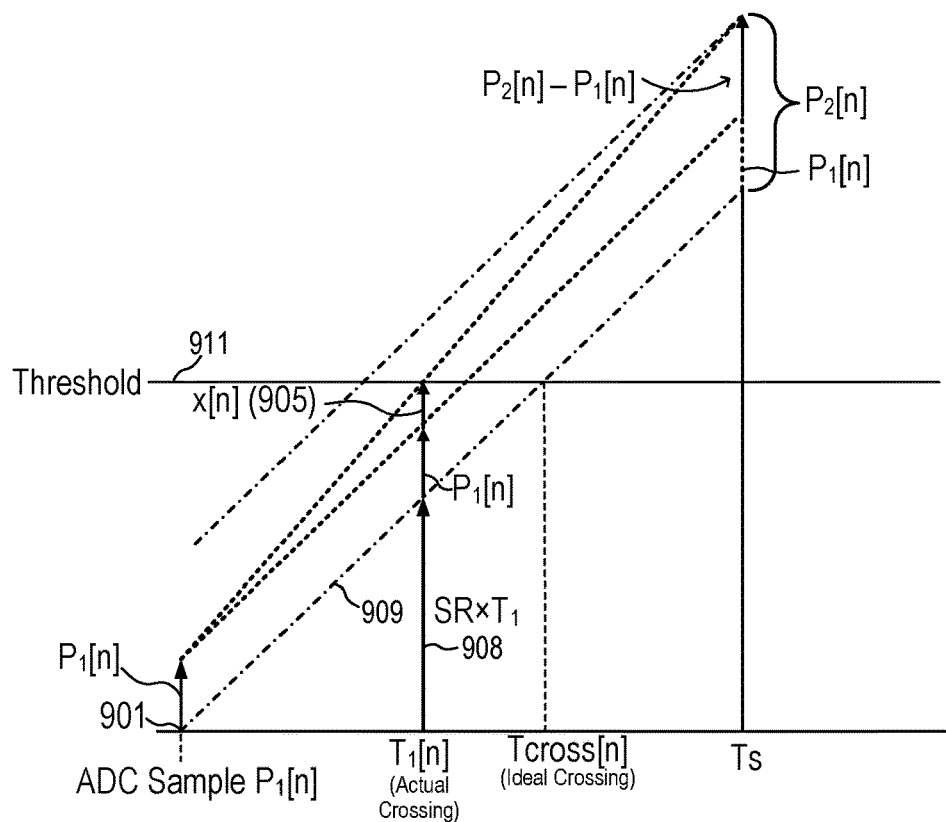
FIG. 9A illustrates steps involved in derivation of the voltage noise to jitter formula.

FIG. 9A illustrates steps involved in derivation of the voltage noise to jitter formula. The ADC sample at time 901 is the sample time of the first sample point $P_1[n]$. $T_{cross}$ is the rising edge threshold crossing point of the ideal clock signal. $T_1$ is the extrapolated new threshold crossing due to input-referred noise and Ts is the time that the second sample P2[n] occurs and the time difference between sample $P_1[n]$ and $P_2[n]$ is the period of the ADC sample clock.

$$x[n] + P_1[n] + (SR \times T_1[n]) = T_{cross}[n] \times SR \quad (2)$$

where x is shown at 905, $P_1$ is shown at 907, SR is the slew rate 909 of the ideal clock signal, $SR \times T_1$ is shown at 908. Equation 2 represents the components of the voltage at the actual crossing time, which equals the threshold voltage 911. But x[n] can also be found as the difference $P_2[n] - P_1[n]$ times the ratio between $T_1[n]/Ts$:

$$x[n] = \frac{(P_2[n] - P_1[n]) \times T_1[n]}{T_s} \quad (3)$$

Solving for $T_1$.

$$T_1[n] = (x[n]) \times \frac{T_S}{(P_2[n] - P_1[n])}. \quad (4)$$

Substituting for $T_1$ from equation 4 into equation (1):

$$x[n] + P_1[n] + SR \times (x[n]) \times \frac{T_s}{P_2[n] - P_1[n]} = T_{cross}[n] \times SR \quad (5)$$

Solving for x:

$$x[n] = (P_2[n] - P_1[n]) \times \frac{(T_{cross}[n] \times SR - P_1[n])}{(P_2[n] - P_1[n] + SR \times T_S)} \quad (6)$$

$P_{effective}[n]$ represents the voltage increase at time $T_1[n]$ needed to get from the voltage $(SR \times T_1[n])$ 908 to the threshold voltage. Thus, $$P_{effective}[n] = P_1[n] x[n] \quad (7)$$

where x[n] is shown at 905, and thus substituting for x[n] in equation (7) yields $$P_{effective}[n] = P_1[n] + (P_2[n] - P_1[n]) \times \frac{(T_{cross} \times SR - P_1[n])}{(P_2[n] - P_1[n] + SR \times T_S)} \quad (8)$$

In order to determine the time error $P_{effective}[n]$ is divided by the slew rate SR.

Figure 9B:
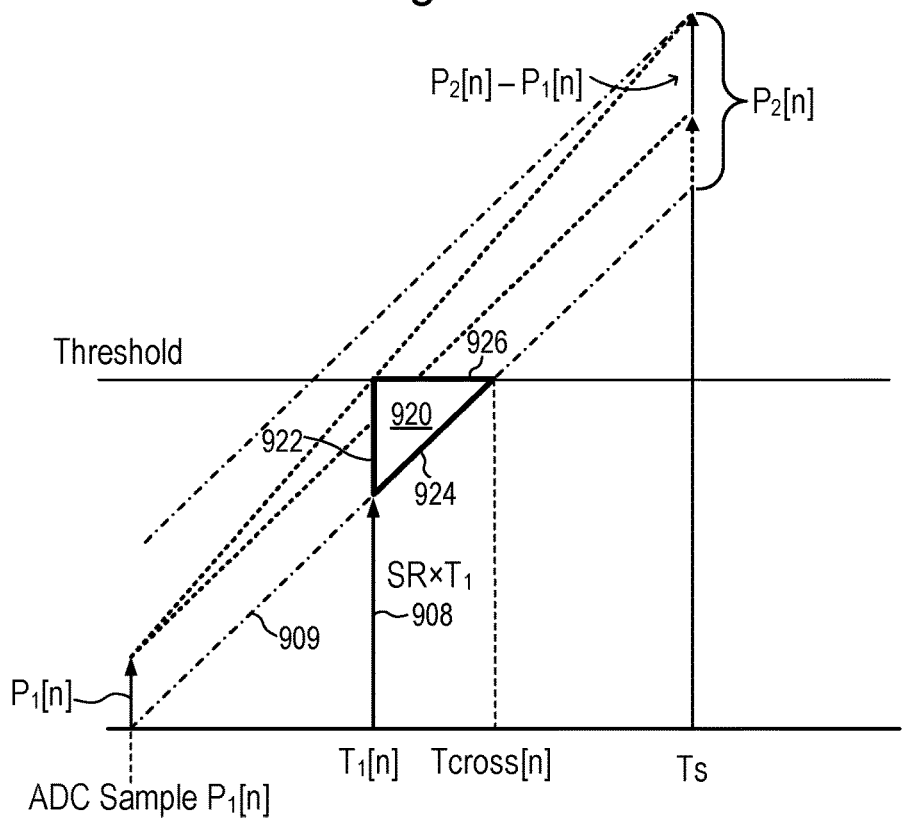
FIG. 9B illustrates the triangle representation of the problem to be solved.

FIG. 9B illustrates the triangle 920. Since one side of the triangle $P_{effective}[n]$ 922 can be determined from equation (8) and the slew rate 909 is known, allowing the second leg 924 of the triangle to be determined, the third leg 926 ($T_{cross}-T1$), which is the TIE, can also be determined.

Figure 10A:
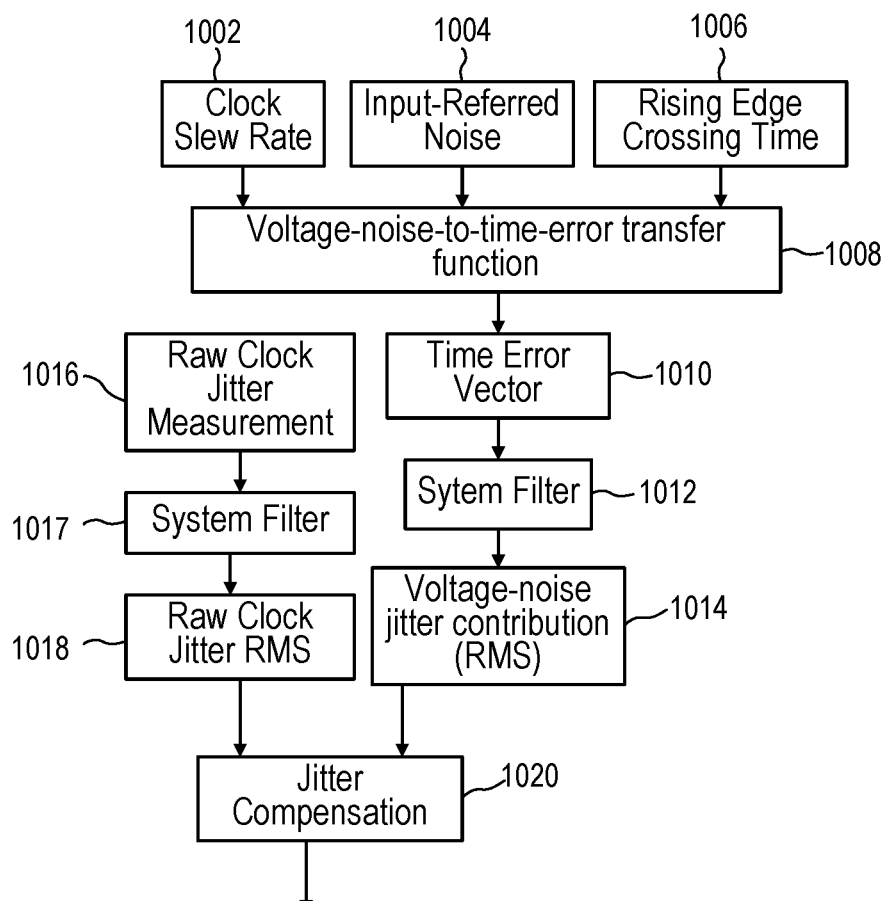
FIG. 10A illustrates a flow diagram of the steps involved in determining a precise jitter measurement of a clock signal under test by correcting for input-referred noise.

FIG. 10A illustrates a flow diagram of the steps involved in determining a precise jitter measurement of a clock signal under test using techniques described herein. The voltage-noise-to-time error transfer function uses three inputs which are the clock slew rate 1002, input-referred noise data 1004, and rising edge crossing times 1006. The clock slew rate 1002 is a measured value of the clock signal under test or an estimated value. The input-referred noise 1004, is a data set obtained by a test setup such as shown in FIG. 4. Finally, the inputs include the rising edge crossing time 1006. The rising edge crossing times can be based on an average period determined during the raw clock jitter measurement of the clock signal under test. The raw clock jitter measurement refers to the jitter measurement of the clock signal under test before correction. The rising edge crossing times can also be based on a nominal value of the clock signal under test. Each crossing time would then be one nominal clock period or average clock period. The ideal jitter free clock signal that is used to determine the crossing times corresponds to the clock signal under test by having an average period of the clock signal under test or a nominal period of the clock signal under test. The voltage-noise-to time-error transfer function 1008 utilizes those three inputs 1002, 1004, and 1006 to generate the time error vector 1010. The time error vector is a vector of all the time errors associated with each rising edge of the ideal clock signal (with a nominal clock period or an average clock period from raw clock data) and is calculated in accordance with equation (1). In an embodiment, 160,000 edges are utilized to form the time error vector for a clock signal at 100 MHz (1.6 ms of data). That amount of sampling provides sufficient resolution bandwidth. A high resolution bandwidth requires more data and a lower resolution requires less data. Note that the maximum or minimum error vector could be used but does not provide as good results as the intermediate time error vector as shown below. Once the time error vector is calculated, a system filter is applied after a fast Fourier transform (FFT) (or other transform) is used to convert the timer error vector to the frequency domain. The system filter is a standard filter specified by a standards group for the system in which the clock signal is intended to be used. For example, a number of filters are specified for jitter analysis for PCIe Gen5, Gen 6 and other generations, e.g., in FIGS. 8.73 and 8-74 to 8.77 of PCI Express® Base Specification Revision 5.0 Version 1.0.

Figure 10B:
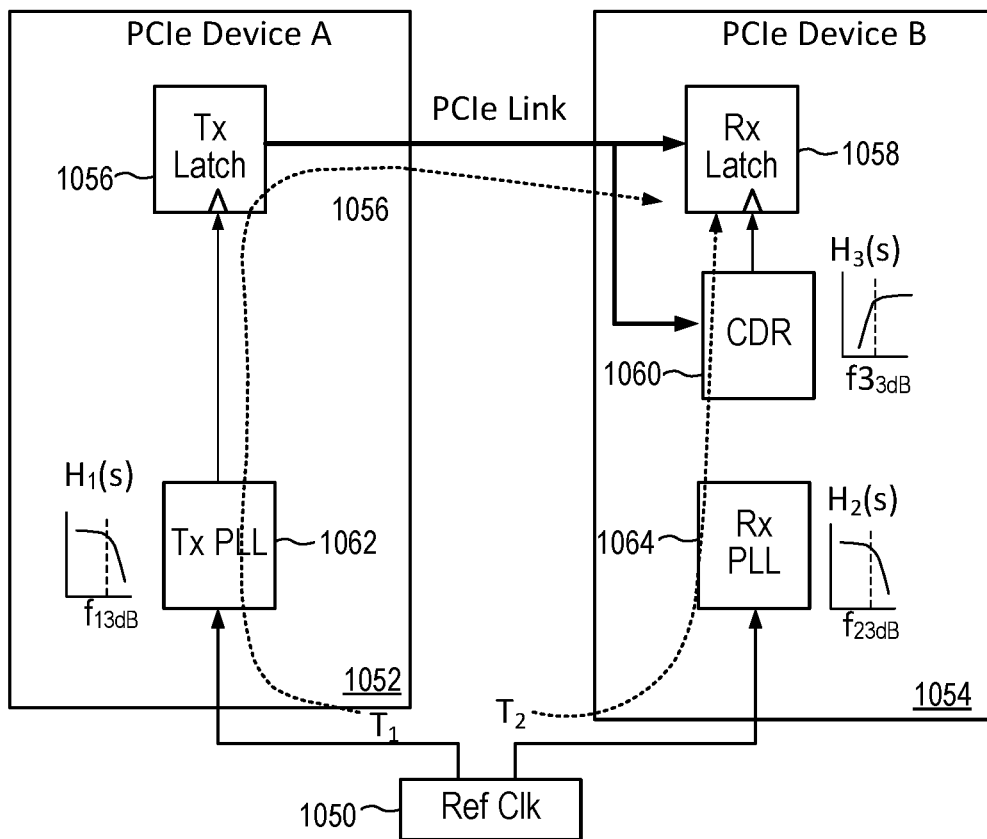
FIG. 10B illustrates an embodiment of an interconnect architecture from which filters are derived.

FIG. 10B illustrates, as an example, the PCI Express® Common Refclk Rx Architecture. In the common clocked architecture, the Refclk 1050 is distributed to both the transmitter 1052 and receiver 1054 of the two PCI-Express devices 1050 and 1052. FIG. 10B shows the transmit (Tx) latch 1056 and the receive (Rx) 1058. The amount of jitter appearing at the clock and data recovery (CDR) circuit 1060 and thus in the clock signal at the receiver latch 1058 is defined by the difference function between the transmitter (Tx) phase-locked loop (PLL) 1062 and receiver (Rx) PLL 1064 multiplied by the CDR 1060 high pass characteristic. FIG. 10B also shows the path delays $T_1$ and $T_2$ and the Refclk path delay difference $T=|T_1-T_2|$. The PCI Express® Base Specification defines $H_1(s)$ for the Tx PLL, $H_2(s)$ for the Rx PLL and $H_3(s)$ for the CDR circuit as:

$$H_1(s) = \frac{2 \cdot s \cdot \zeta_1 \cdot \omega_{n1} + \omega_{n1}^2}{s^2 + 2 \cdot s \cdot \zeta_1 \cdot \omega_{n1} + \omega_{n1}^2}$$

where $\zeta$ is a damping factor and $\omega$ is the natural frequency.

$$H_2(s) = \frac{2 \cdot s \cdot \zeta_2 \cdot \omega_{n2} + \omega_{n2}^2}{s^2 + 2 \cdot s \cdot \zeta_2 \cdot \omega_{n2} + \omega_{n2}^2}$$

$$H_3(s) = \frac{s}{s + \omega_3}$$

The transfer function $$H(s) = (H_1(s)e^{-sT} - H_2(S))H_3(s) \quad \text{or} \quad (H_2(s)e^{-sT} - H_1(s))H_3(s).$$

The filter parameters are supplied for various speeds of the interconnect to determine the jitter. Note that other embodiments may use other filters that model the particular interconnect in order to determine the jitter of interest for a particular interconnect operating in a particular environment.

The particular filter of interest (and the particular filter used is selectable) is applied to the time error vector in the frequency domain and a root mean square (RMS) value of the TIE is extracted from the filtered power spectrum density. To convert the filtered power spectrum density to RMS, the voltage spectral density is squared, integrated across the desired bandwidth, and the square root of the result is taken. Alternatively, the filtered time error vector can be transformed back to the time domain using an inverse transform and the RMS taken in the time domain. In an embodiment, the jitter contribution determination step 1014 integrates the jitter in seconds across the desired bandwidth of 10 kHz to 50 MHz. Once the RMS value is determined in 1014, the jitter compensation can be applied. However, before jitter compensation is applied, the RMS value of the jitter in the raw clock measurement needs to be determined.

The system makes the raw clock jitter measurement using a test setup as shown, e.g., in FIG. 2. The sampled data is provided to the raw clock measurement block 1016 that determines the jitter of the raw clock measurement by comparing the length of the period of the measured clock under test based on rising edge crossing times to a nominal clock signal without jitter. Each period of the sampled clock signal is measured as follows:

$$P[i] = T_{crossing[i]} - T_{crossing[i-1]}$$

and the time interval error is calculated as:

$$TIE_{raw}[i] = i \times P_{nominal} - \sum_{k=0}^{i} P[k]$$

Once the raw samples are obtained, the raw clock measurement block calculates the crossing times, calculates the period vector, and also calculates a mean of the period vector, which can be used as the nominal period. Alternatively, a nominal value of a frequency is utilized to determine the period, e.g., 100 MHz instead of a 99.997 MHz average frequency, since the error caused by using a nominal clock signal is small. Once the TIE raw vector is calculated from all the periods in the data set, a transform such as a discrete Fourier transform (DFT), is applied to the TIE raw jitter vector to move the TIE raw jitter vector into the frequency domain. The same system filter is applied to a TIE raw jitter vector as is applied to the time error vector indicative of the input-referred noise in 1017. The same or a nearly identical system filter should be applied to both the raw jitter and the input-referred noise jitter to minimize calculation errors due to differences in the filter function. From the filtered power spectrum density, the RMS value of the raw jitter vector is determined in 1018 and the jitter compensation block 1020 uses the RMS value from 1018 and the RMS value from 1014 to compensate for jitter caused by input-referred noise. The corrected jitter $J_{corrected}$ is determined as:

$$J_{corrected} = \sqrt{J_{raw}^2 - J_{error}^2}$$

Note that $J_{raw}$ and $J_{error}$ are the RMS values from steps 1018 and 1014, respectively.

Figure 11:
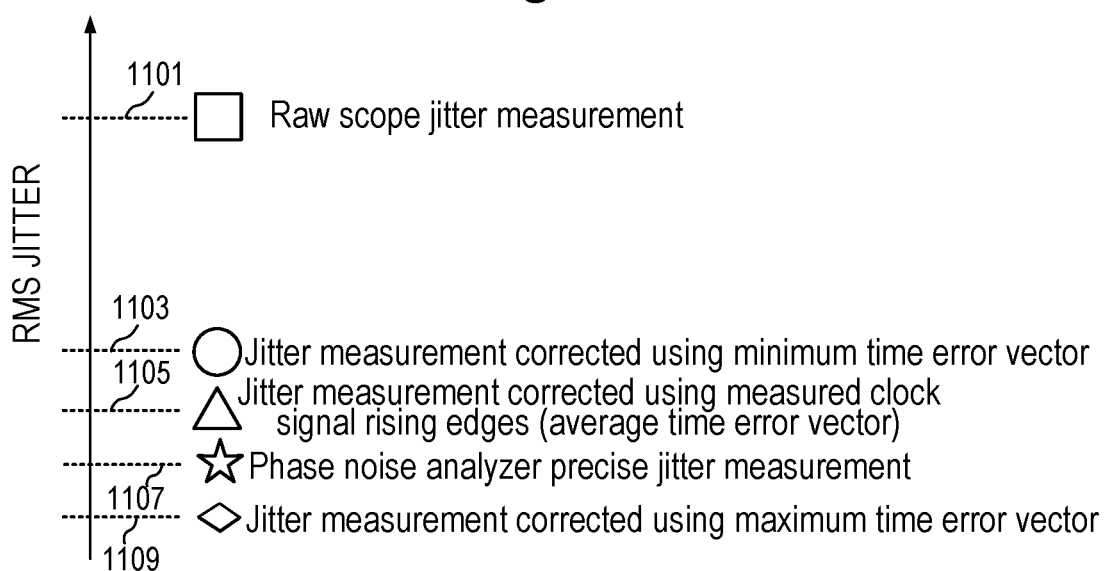
FIG. 11 illustrates relative performance of various jitter measurements using different techniques to make jitter corrections.

FIG. 11 illustrates relative performance of various jitter measurements using different techniques to determine jitter and make jitter correction. The RMS jitter for the raw scope jitter measurement, provided, e.g., from 1018 is shown at 1101. The corrected RMS jitter measurement at 1103 was corrected by subtracting the input-referred noise jitter determined using the minimum time error approach. As can be seen, the correction reduces the jitter but under corrects. When the jitter is corrected using the intermediate time error vector for the rising edge correction described in equation 1 and shown at 1105, the jitter corrected jitter measurement 1105 is less than the jitter corrected measurement made at 1103 and closer to the precise jitter measurement at 1107 made with a phase noise analyzer. Finally, the jitter correction shown at 1109 that subtracts the input-referred noise jitter from the raw scope jitter measurement, uses the input-referred noise jitter that was determined using the maximum time error. That jitter correction over corrects for the jitter error caused by input-referred noise and results in the corrected jitter being smaller than the accurately measured jitter.

Figure 12:
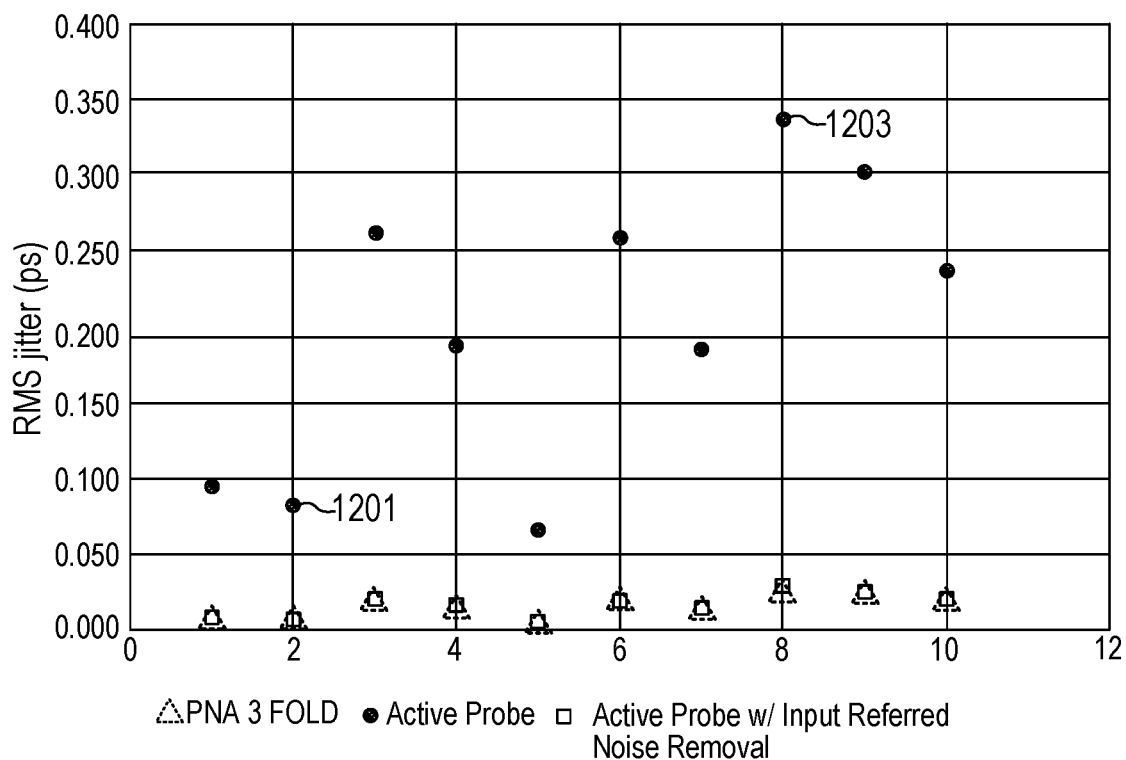
FIG. 12 illustrates measured results using the jitter correction described herein.

FIG. 12 illustrates measured results using the jitter correction determined as shown in the flow chart of FIG. 10A. The X axis of FIG. 12 indicates possible filter combinations allowed by the PCIe Gen5 standard and each filter corresponds to a filter used in the system filter block 1012 in the flow chart shown in FIG. 10A. For each filter there is an RMS Jitter value determined using an active probe marked as black circles in FIG. 12, e.g. 1201 and 1203. There is also an RMS jitter for the input-referred noise (not shown in FIG. 12) used to make the jitter corrections for each filter and thereby isolate the device under test RMS jitter marked as squares by compensating for the jitter caused by input-referred noise. Some of the filters pass more of the input-referred noise than other filters, depending on the filter bandwidth. As long as the compensation uses the same system filter to capture the raw clock jitter measurement the resulting compensation is effective. FIG. 12 shows that a small raw clock signal jitter 1201 using filter 2 indicates that filter 2 is a narrow-band filter while filter 8 is a wide band filter that passes more of the device under test clock signal jitter. The results shown in FIG. 12 can be checked by noting that if the filter bandwidth is narrow the filter attenuates both the signal and the noise. The squares in FIG. 12 showing the compensated jitter are generally coincident with accurately measured jitter shown as triangles in FIG. 12 and made using the a most accurate jitter measurement tool available with the lowest noise floor—the phase noise analyzer (PNA). The PNA extracts the jitter from the clock under test after an analog down conversion, hence the PNA will not have the aliasing effects inherent in sampled systems, such as oscilloscopes. To provide a more accurate baseline to an oscilloscope jitter measurement, the aliasing effect is emulated with a flat extension of the phase noise curve applied to the PNA data up to 3 times the Nyquist frequency by RMS addition of 3 times (3 FOLD) the extended noise value back into the integration band before the RMS jitter is calculated to obtain the data points represented as triangles.

Figure 13:
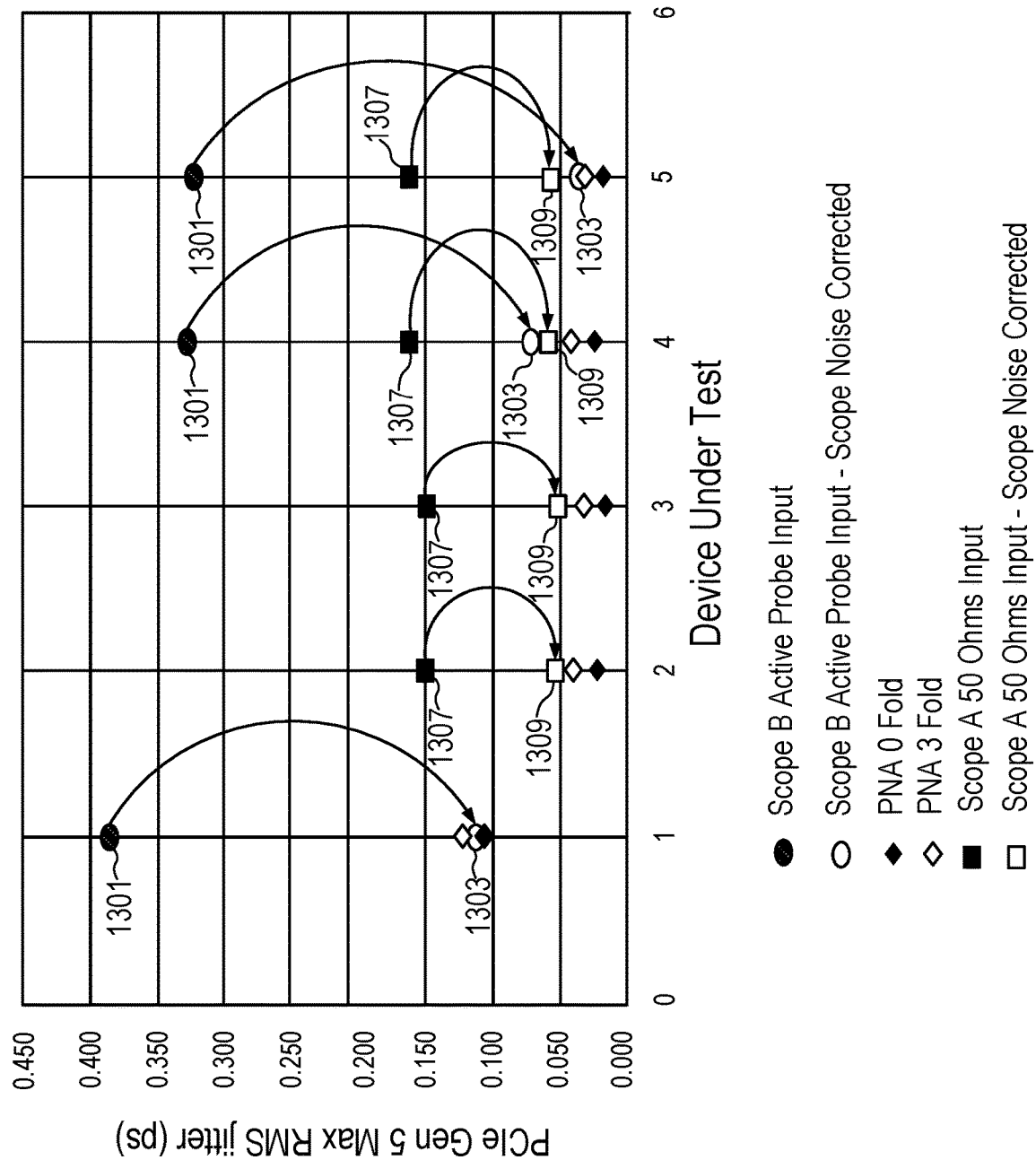
FIG. 13 illustrates measured results showing the maximum jitter errors using a plurality of filters and measuring instruments for multiple devices and the corrections made to the jitter measurements.

FIG. 13 shows additional measured results. Five different devices under test were tested using all the PCIe Gen5 filters and the maximum RMS jitter was determined for each device. In addition, two different oscilloscopes were used and a PNA. One of the oscilloscopes used an active probe and another of the oscilloscopes used 50 ohm termination to get a better jitter measurement. FIG. 13 shows the oscilloscope with the active probe had the highest jitter measurements 1301 (as expected) and the jitter corrected value 1303 were close to the accurate jitter measurements PNA 0 Fold and PNA 3 Fold. The corrected jitter measurements 1303 can be seen to be below the PCIe Gen5 RMS jitter limit of 0.150 ps. The second oscilloscope with the 50 ohm termination had lower jitter measurements 1307 that were close to the PCIe Gen 5 RMS jitter limit. With correction, the corrected jitters measurements 1309 are below the jitter limit and close to the PNA measurements made. The jitter corrections for the measurement data were made in accordance with the approach described in FIG. 10A.

The input-referred noise compensation approach described herein allows the use of lower cost oscilloscopes for testing rather than more expensive specialized jitter measurement tools. Without the removal approach described herein, it is difficult for a user to do accurate jitter measurements and signal integrity clock measurements simultaneously on PCIe systems. Without the input-referred noise compensation approach, the user has to choose between using a 50 ohm SMA termination to get a clean jitter measurement and distort the signal, ruining the signal integrity measurement or use an active probe, that will keep the signal pristine, but give excessive high jitter values. The input removal compensation approach described herein allows a clean jitter measurement with the active probe.

Thus, a compensation technique has been described that compensates for the input-referred noise voltage during jitter measurements. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A non-volatile computer readable medium storing instructions to determine jitter in a clock signal under test that, when the instructions are executed by a processor, cause the processor to:
  determine two points of input-referred noise data for a crossing time, a first point of the two points being before the crossing time and a second point of the two points being after the crossing time, the crossing time being a time that a clock signal representation crosses a threshold value, the clock signal representation corresponding to the clock signal under test; and
  determine a first time error associated with the crossing time using a displacement to the clock signal representation caused by the first point of the input-referred noise data, a displacement to the clock signal representation caused by the second point of input-referred noise data, a clock slew rate of the clock signal representation, a period of a sampling clock of an analog to digital converter used to generate the input-referred noise data, and the crossing time, the first time error indicative of a change in the crossing time due to the input-referred noise data.

2. The non-volatile computer readable medium as recited in claim 1 wherein the instructions further cause the processor to:
  determine additional time errors for respective additional crossing times; and
  determine a time error vector based on the first time error and the additional time errors.

3. The non-volatile computer readable medium as recited in claim 2 wherein the respective additional crossing times are based on an average clock period of the clock signal under test.

4. The non-volatile computer readable medium as recited in claim 2 wherein the respective additional crossing times are based on a nominal clock period of the clock signal under test.

5. The non-volatile computer readable medium as recited in claim 1 wherein the first point is a closest sample of the input-referred noise data before the crossing time and the second point is a closest sample of the input-referred noise data after the crossing time.

6. The non-volatile computer readable medium as recited in claim 2 wherein the instructions further cause the processor to:
  perform a transform to the time error vector to generate a frequency domain time error vector;
  apply a system filter to the frequency domain time error vector to generate a filtered time error vector; and
  determine a first root mean square value of the filtered time error vector using the filtered time error vector.

7. The non-volatile computer readable medium as recited in claim 6 wherein the instructions further cause the processor to:
  correct a second root mean square value using the first root mean square value, the second root mean square value associated with jitter measurements of the clock signal under test to thereby determine a compensated jitter measurement of the clock signal under test.

8. The non-volatile computer readable medium as recited in claim 7 wherein the instructions further cause the processor to:
  generate a frequency domain raw clock signal time error vector;
  apply the system filter to the frequency domain raw clock signal time error vector to generate a filtered raw clock signal time error vector; and
  determine the second root mean square value using the filtered raw clock signal time error vector.

9. The non-volatile computer readable medium as recited in claim 1 wherein the instructions further cause the processor to determine the first time error as:

$$TIE_{noise}[n] = \frac{\left(P_1[n] + (P_2[n] - P_1[n]) \times \frac{SR \times T_{crossing}[n] - P_1[n]}{SR \times T_{period} + P_2[n] - P_1[n]}\right)}{SR},$$

where P1[n] is the first point, P2[n] is the second point, Tperiod is a period of a sampling clock of an analog to digital converter used to generate the input-referred noise data, SR is the clock slew rate, Tcrossing[n] is the crossing time, and n is an index of the crossing time.

10. A method of determining jitter in a clock signal under test comprising:
  determining two points of input-referred noise data for each crossing time of a plurality of crossing times, a first point of the two points before the crossing time and a second point of the two points after the crossing time, the crossing times indicating when a clock signal representation corresponding to the clock signal under test crosses a threshold voltage value;
  determining respective time errors associated with the crossing times using, for each crossing time of the plurality of crossing times, a displacement to the clock signal representation caused by the first point of the input-referred noise data, a displacement to the clock signal representation caused by the second point of input-referred noise data, a slew rate of the clock signal representation, a period of a sampling clock of an analog to digital converter used to generate the input-referred noise data, and the crossing time, each of the respective time errors indicative of a change in respective ones of the crossing times due to input-referred noise indicated by the input-referred noise data; and
  determining a time error vector based on the respective time errors.

11. The method as recited in claim 10 further comprising:
  grounding an input to a probe of an instrument used to measure the clock signal under test; and
  generating the input-referred noise data with the input grounded.

12. The method as recited in claim 10 wherein the crossing times are based on an average clock period of the clock signal under test.

13. The method as recited in claim 10 wherein the crossing times are based on a nominal clock period of the clock signal under test.

14. The method as recited in claim 10 further comprising:
  applying a transform to convert the time error vector to a frequency domain time error vector;
  applying a first system filter to the frequency domain time error vector and generating a filtered time error vector;
  applying an inverse transform to the filtered time error vector; and
  determining a first root mean square value of a time domain representation of the filtered time error vector after the inverse transform.

15. The method as recited in claim 14 further comprising correcting a second root mean square value indicative of a jitter measurement of the clock signal under test using the first root mean square value to generate a compensated jitter measurement of the clock signal under test.

16. The method as recited in claim 14 further comprising sampling the clock signal under test in clock signal measuring equipment that includes an analog to digital converter to convert the clock signal under test to sampled digital values.

17. The method as recited in claim 15 further comprising:
   determining a raw jitter component of the clock signal under test as a raw jitter vector;
   converting the raw jitter vector to a frequency domain raw jitter vector;
   applying a second system filter to the frequency domain raw jitter vector to generate a filtered raw jitter vector; and
   determining the second root mean square value using the filtered raw jitter vector.

18. The method as recited in claim 17 wherein the first system filter and the second system filter are identical filters.

19. The method as recited in claim 10 wherein the first point is a closest point to the crossing time before the crossing time and the second point is a closest point after the crossing time.

20. The method as recited in claim 10 further comprising determining each of the time errors as:

$$TIE_{noise}[n] = \frac{\left(P_1[n] + (P_2[n] - P_1[n]) \times \frac{SR \times T_{crossing}[n] - P_1[n]}{SR \times T_{period} + P_2[n] - P_1[n]}\right)}{SR},$$

where $P_1[n]$ is the first point, $P_2[n]$ is the second point, $T_{period}$ is a period of a sampling clock of an analog to digital converter used to generate the input-referred noise data, SR is the slew rate of the clock signal representation, $T_{crossing}[n]$ is the crossing time, and n is an index of the crossing time.

* * * * *